(12) United States Patent
Dagan et al.

(10) Patent No.: US 6,614,288 B1
(45) Date of Patent: Sep. 2, 2003

(54) ADAPTIVE DRIVE CIRCUIT FOR ZERO-VOLTAGE AND LOW-VOLTAGE SWITCHES

(75) Inventors: Marc Dagan, Mountain View, CA (US); Carl Keith Sawtell, San Jose, CA (US); David Anthony Smith, Oxford (GB)

(73) Assignee: Astec International Limited, Hong Kong (HK)

( * ) Notice: Subject to any disclaimer, the term of this patent is extended or adjusted under 35 U.S.C. 154(b) by 0 days.

(21) Appl. No.: 09/662,498

(22) Filed: Sep. 14, 2000

Related U.S. Application Data

(63) Continuation of application No. 09/082,604, filed on May 20, 1998, now abandoned.

(51) Int. Cl.[7] ............................................. H03K 17/00
(52) U.S. Cl. ........................ 327/365; 327/376; 327/377; 327/387; 363/20; 363/21
(58) Field of Search ................................ 327/365, 376, 327/377, 387, 392, 398, 399; 363/19, 20, 21

(56) References Cited

U.S. PATENT DOCUMENTS

| | | | |
|---|---|---|---|
| 5,066,900 A | * | 11/1991 | Bassett ........................ 323/335 |
| 5,349,514 A | * | 9/1994 | Ushiki et al. .................. 363/21 |
| 5,442,312 A | * | 8/1995 | Walter .......................... 327/392 |
| 5,576,654 A | * | 11/1996 | Shu et al. ..................... 327/433 |
| 5,781,039 A | * | 7/1998 | Carlberg ....................... 327/44 |
| 5,894,216 A | * | 4/1999 | Cohen .......................... 323/284 |
| 5,920,475 A | * | 7/1999 | Boylad et al. ............... 363/127 |

* cited by examiner

Primary Examiner—Timothy P. Callahan
Assistant Examiner—An T. Luu
(74) Attorney, Agent, or Firm—Coudert Brothers LLP

(57) ABSTRACT

A circuit for controlling the switching behavior of a field effect transistor (FET) or other power switch in a power supply or converter. The circuit includes an adaptive feedback loop which controls the switching operation of the FET through application of a gate drive signal to the device. The circuit is designed to turn the switching device on or off at the optimum time to reduce the stress and power losses associated with the switching action. The circuit includes a capacitor connected to the FET switch drain to sense the falling voltage across the switch. The adaptive gate drive circuit holds the FET switch off until the drain voltage sensed by the capacitor stops decreasing. At this time, the FET switch voltage is either zero (zero-voltage switching) or has reached the minimum value of its resonant ring (low-voltage switching). The gate drive circuit then turns the FET switch on, initiating a new cycle of charging up the inductor or primary transformer winding which is part of the power supply or converter. The present invention, thus acts, to minimize switching stress and power loss during the switching cycle.

27 Claims, 8 Drawing Sheets

Clock Signal
(Node 1)
FIG. 2B-1
Time Delayed
Clock Signal
FIG. 2B-2
Switch Voltage
(Vds)
At Node (2)
FIG. 2B-3
Current In
Capacitor
Ca
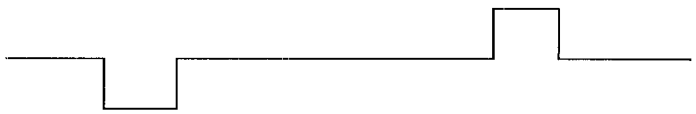
FIG. 2B-4
Voltage At
Node (3)
&
Node (4)
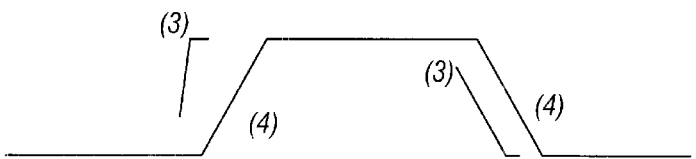
FIG. 2B-5
Current In
Switch
Capacitor
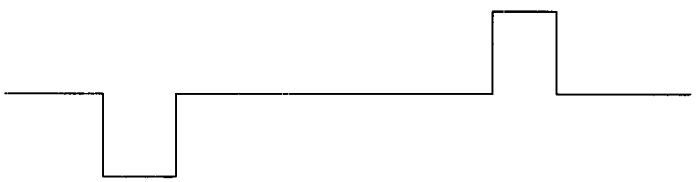
FIG. 2B-6
Current In
Switch
Diode
FIG. 2B-7
Current In
Switch
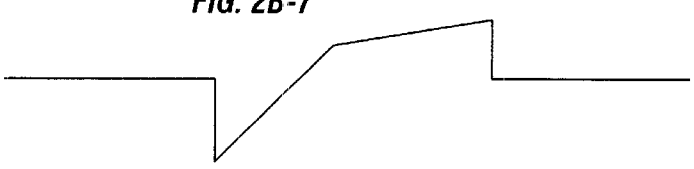
FIG. 2B-8

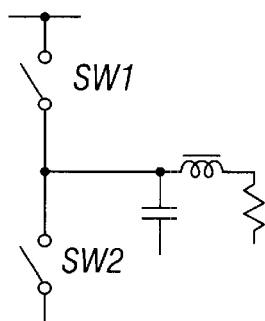

FIG. 5A

(Initial Condition Sw1 Closed Sw2 Open) Clock

SW1 Gate Voltage

⊢ Propagation Delay

Voltage At Switch Node

Minimun Time Delay To Allow SW1 To Open, And SW2 Voltage To Start To Fall.

Timing Window When SW2 May Be Closed

Maximun Time Delay Before SW2 Closed. Allows Converter To Start. $t_0$

Measure Switch Node dV/dt

Turn SW2 On When Voltage Stops Falling, Ignore dV/dt As Switch Is Turned On.

SW2 Gate Voltage

FIG. 5B

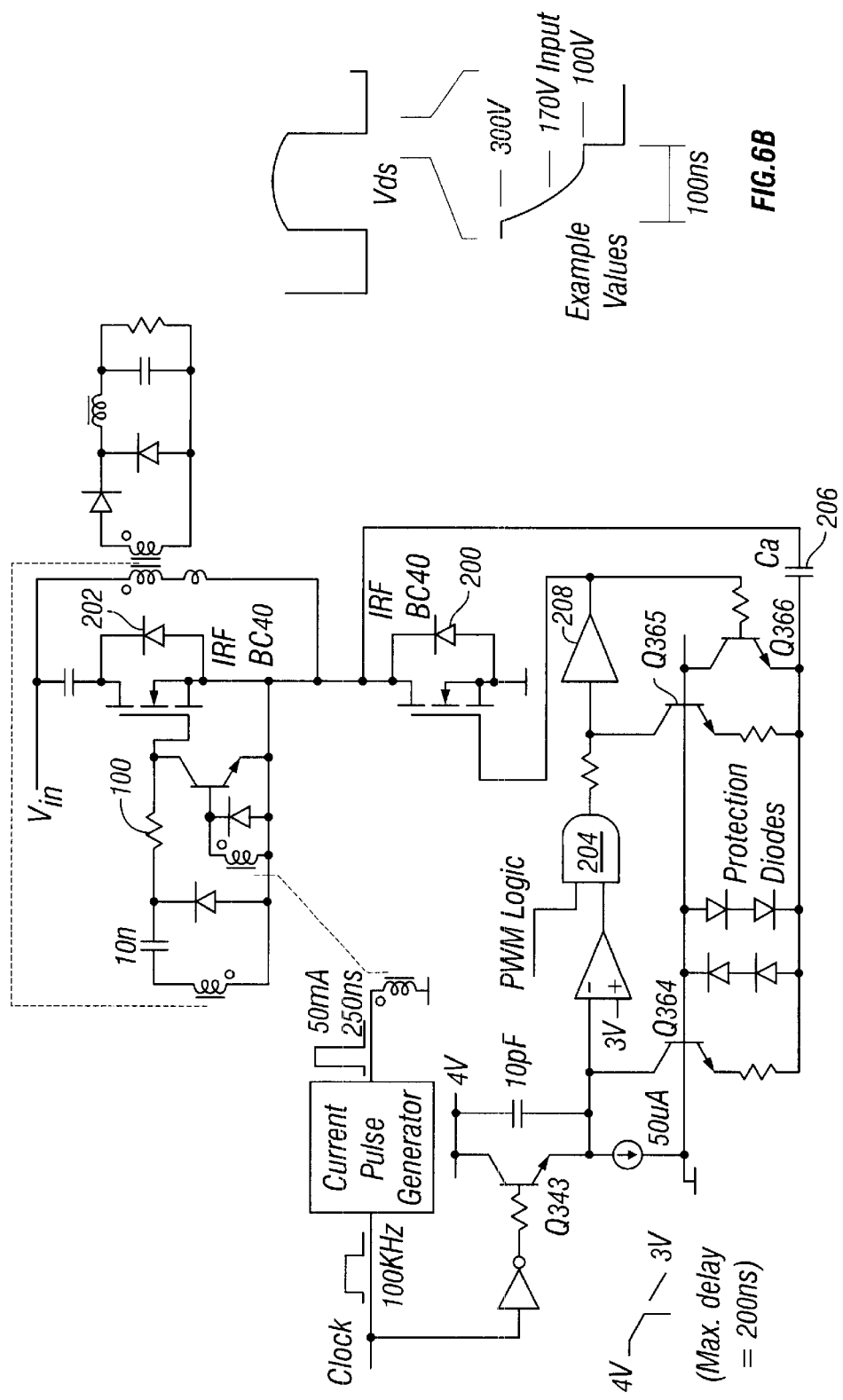

ADAPTIVE DRIVE CIRCUIT FOR ZERO-VOLTAGE AND LOW-VOLTAGE SWITCHES

This application is a continuation of U.S. Ser. No. 09/082,604, filed May 20, 1998, now abandoned.

BACKGROUND OF THE INVENTION

1. Field of the Invention

The present invention relates to switched power supplies, and more specifically, to a circuit which controls the operation of a switch in such a power supply. The circuit uses an adaptive control loop to change the state of the switch at the optimum time to minimize switching stress and power loss. The inventive circuit may also be used to control the change of state of a switch in other types of power controlling circuits in which the optimal switching time is dependent upon the voltage through the switch.

2. Description of the Prior Art

Switching or "switch mode" power supplies use a semiconductor device as a power switch to control the application of a voltage to a load. In a flyback power converter, for example, when the power switch is in the "on" position (i.e., the device is conducting), the voltage is applied across a transformer, which stores energy in its magnetic core as the current through it increases. When the power switch is in the "off" position (i.e., the device is not conducting), the inductor voltage increases as the circuit attempts to compensate for the reduction in current by generating a back emf. The inductor voltage "flies back" above the input voltage and is typically clamped by a diode (or the body diode of a second switching device) at the output voltage level. With the diode being conductive, the stored energy in the transformer is transferred to an output capacitor and the other elements of the load. The current through the transformer then decreases until the energy in the magnetic core is depleted. The power switch is then turned back on to start another cycle. Just before being turned on, the voltage across the power switch is greater than the input voltage. As the power switch is turned on, the voltage falls and current in the switch increases, resulting in a loss of power.

The switching operation of the power switch is often controlled by a clock signal, with the duty cycle of the switch (the relative "on" versus "off" time during the switching period) determining the output voltage of the circuit. This method of controlling the switch operation is termed "pulse width modulation" (PWM).

In some configurations of switched mode supplies, the load of the circuit may include a resonant network (typically an inductor and a capacitor) which acts to smooth the output signal and provide a back emf in the form of a sinusoidally varying waveform. This provides a zero-voltage or zero-current condition through the power switch which can be used to define the desirable switching point(s).

A "half-bridge" (or Class-D inverter) is another type of switch mode power converter topology which is used to provide a dc source. In such a configuration, a center-tapped dc source is provided by using two smoothing capacitors in conjunction with two switching devices. The switching devices are operated so that they are alternately switched "on." This can be accomplished by driving one of the switching devices with a clock signal which is an inverted version of the clock signal for the other device.

The switching devices in switch mode power converters are subjected to high stresses and potentially high switching power loss as a result of the switch being changed from one state to another while having a significant voltage across it. These effects increase linearly with the switching frequency of the PWM. Another drawback of switched power circuits is the electromagnetic interference arising from the large di/dt and dv/dt caused by the switch mode operation.

The noted disadvantages of switch mode power circuits are reduced if each power switch in the circuit is caused to change its state (from "on" to "off" or vice versa) when the voltage and/or current through it is zero or at a minimum. Such a control scheme is termed "zero-voltage" and/or "zero-current" switching. In the case of switching at a minimum voltage, the control scheme is termed "low-voltage" switching. It is therefore desirable to switch the switching device at instances of zero or minimum voltage in order to reduce stress on the switch and power loss of the power supply or converter.

In Zero Voltage Switching (ZVS) power converters, during each switching cycle the switch voltage is driven to zero by the action of the inductive load, and ideally the switch is then turned on. ZVS Resonant converters have a large LC tank to ensure that there is always sufficient inductive energy to drive the switch voltage to zero. In contrast, active Clamp ZVS Forward and Flyback converters have a relatively small inductance between switch and transformer, with smaller inductive energy and hence lower losses than resonant converters. However, the small inductance between switch and transformer causes two problems. Firstly, there is only a small amount of energy stored in the inductance to ring the switch voltage down towards ground. If there is insufficient energy for the switch voltage to reach zero, then the switch should ideally be turned "on" when the voltage is at a minimum, before it rings back up again. This corresponds to Low Voltage Switching (LVS) operation. Secondly, the LC tank circuit formed by the small inductance and switch capacitance has a high resonant frequency. This means that there is only a small window of time for turning the switch "on" at zero (or low) voltage. If the switch state is changed too soon or too late, there will be a potentially significant power loss associated with the switching operation.

One method of controlling the switch action in order to reduce power losses is for the switch control circuit to use a fixed time delay before turning the power switch on, where the delay is chosen to be approximately long enough for the switch voltage to have reached zero volts or its minimum value. Examples of this approach are found in the Unitrode UCI 875 range of Phase Shift Resonant Controllers, and the UC1580 range of Active Clamp/Reset PWM controllers, manufactured by the Unitrode Corporation. However, a disadvantage to this approach is that it allows for no variation in the amount of the fixed delay to take into account differences in the load, operating conditions, or parts tolerances arising in a high volume production environment. This situation can cause the power supply or converter to operate in a sub-optimal manner, because if the switching event occurs even a small amount of time after the point of minimum switch voltage, the switch voltage may be much higher, resulting in a large power loss. Another disadvantage of this approach is that the fixed delay must be designed into the switch controller. This creates a burden on the designer to optimize the component values for the circuit.

An improved approach to controlling the action of the power switch is to detect a zero voltage condition across the power switch. Examples of this approach are found in the Unitrode UCI 861 range of Resonant-mode Power Supply Controllers and the UCI 872 range of Resonant Lamp Ballast Controllers. In such devices, the power switch field effect transistor (FET) drain terminal is connected via a high value resistor to a "Zero Detect" pin, which generates a synchronization pulse (for the control circuit oscillator) when the resonant waveform falls to zero.

While this approach is an improvement over circuits which change the state of the switching device based only on a fixed delay, it does have a disadvantage. This is because the zero detect method relies on the existence of a zero voltage condition to trigger the switch control signal. The resistive element used as part of the switch voltage sensor senses the actual voltage across the switching element and hence does not generate a switch control signal until that voltage is exactly zero. Thus, the "Zero Detect" method found in the Unitrode devices requires the converter to be designed with sufficient inductive energy to ensure that the switch voltage always falls to zero at the end of each cycle. If the switch voltage does not fall to zero, then the Unitrode controller may default to a mode of operation in which it waits for the elapse of a fixed delay, and then turns the switch on (e.g., the first cycle after the power supply has been turned on). This will not be the optimum time for reducing switching related power losses. This is because during this delay the switch voltage may rise above zero (or its minimum), thereby increasing the power loss associated with the switching action.

Yet another approach to the reduction of power losses associated with switching operations is described in "A Low-Cost Control IC for Single-Transistor ZVS Cold-Cathode Fluorescent Lamp Inverters and DC/DC Converters", Redl et al., Proceedings of the Twelfth Annual Applied Power Electronics Conference and Exposition (APEC '97), vol. 2, pages 1042–1049. The control IC described in the Redl paper has a zero voltage detection pin which is connected via a diode to the switching element, and turns on the switch when the switch voltage falls below 2V. If the switch voltage does not fall below 2V, then the IC oscillator will turn on the switch after a preset delay. This corresponds to the maximum time delay value and it acts to turn the switch "on" if the ZVS gate drive circuit has not done so. This approach is thus a combination of a zero-detect and fixed delay technique.

However, as with the Unitrode approach discussed above, the method described in the Redl et al. paper cannot be used to turn the switch on at the switch voltage minimum (LVS operation) unless that minimum happens by coincidence to be 2 volts in a given instance. Consequently, the Redl et al. method will either turn on the switch before the switch voltage minimum, if that value is less than 2 volts, or will wait for the expiration of the default maximum time delay if the switch voltage minimum is greater than 2 volts. In either case, power loss associated with the switching action is not minimized.

What is desired is a circuit for controlling the operation of a switching device in a power supply, power converter, or other circuit so that the switching action occurs at the optimum time to minimize the stress and power loss associated with the change in state of the switch. It is also desired that the operation of the switch control circuit be independent of the tolerances of the circuit's components and be adaptable to change the state of the switch at the optimal time based upon the condition of the circuit of which the switch is a part, regardless of whether a condition of zero voltage occurs across the switching element.

SUMMARY OF THE INVENTION

The present invention is directed to a circuit for controlling the switching behavior of a power switch (typically a field effect transistor (FET)) in a power supply, power converter, or other power controlling circuit. The inventive circuit includes an adaptive feedback loop which controls the switching operation of the FET through application of a gate drive signal to the device. The circuit is designed to turn the switching device on or off at the optimum time to reduce the stress and power losses associated with the switching action. The circuit includes a capacitor connected to the FET switch drain to sense the falling voltage across the switch. The adaptive gate drive circuit holds the FET switch off until the drain voltage sensed by the capacitor stops decreasing. At this time, the FET switch voltage is either zero (zero-voltage switching) or has reached the minimum value of its resonant ring (low-voltage switching). The gate drive circuit then turns the FET switch on, initiating a new cycle of charging up the inductor or primary transformer winding which is part of the power supply or converter. The present invention thus acts to minimize switching stress and power loss during the switching cycle.

Broadly stated, the present invention comprises a sensor responsive to a voltage across a switch to produce a sensor output signal proportional to a rate of change of the voltage across the switch and a switch state control signal generator responsive to the sensor output signal to generate a control signal to change the state of the switch when the sensor output signal is substantially equal to a predetermined value, e.g., zero.

BRIEF DESCRIPTION OF THE DRAWINGS

FIG. 2B-1 to 2B-8 shows the waveforms for the signals involved in the control of the operation of the switching FETs of FIG. 2A.

FIG. 5A is a diagram of a two-switch LVS converter which may be operated using the adaptive gate drive circuit of the present invention.

FIG. 5B is a timing diagram showing a typical timing sequence for operation of the two-switch LVS converter of FIG. 5A.

FIG. 6A is a schematic diagram showing the adaptive gate drive circuit of the present invention as used in an active clamp forward converter circuit.

FIG. 6B is a graph of the voltage through the power switch for the circuit of FIG. 6A.

DETAILED DESCRIPTION OF THE INVENTION

Figure 1A:
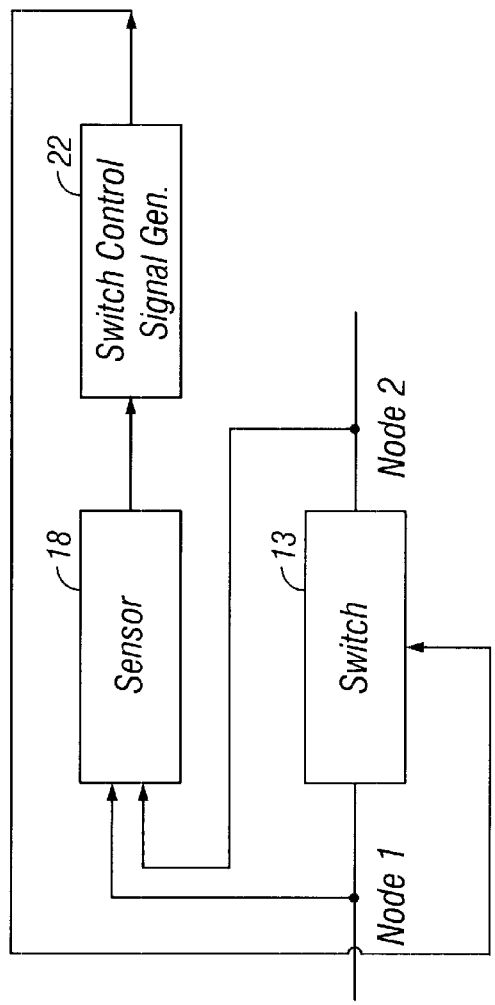
FIG. 1A is a block diagram of the adaptive drive circuit of the present invention in a form suited for use in a general power controlling circuit.

In accordance with the present invention, an adaptive drive circuit designed to turn on the power switch of a switch mode power supply, power converter, or other power controlling circuit at the optimum time to reduce switch stress and power loss is described. The adaptive circuit controls the switching behavior of the power switch based upon the condition of the power supply, power converter, or other circuit, and thus operates independently of parts tolerances, loading conditions, or a prediction of the timing of the voltage magnitude through the switch. The adaptive circuit includes a sensor which is used to detect the changing drain voltage of the FET power switch (or other switching element) of the power supply or converter. When the voltage across the switch reaches zero or a minima (i.e., the rate of change is approximately zero), the inventive circuit controls the application of a drive signal to the switch so that the switch changes state. This causes the switching action of the power switch to occur in a situation where zero or minimal voltage is across it, thereby reducing the stress and power loss associated with the change of state.

In a more general embodiment, the present invention takes the form of a circuit which may be used to monitor the rate of change of voltage across a switching element and to generate a control signal to cause a change of state of the element when the voltage reaches either zero or a minimum value. By using a sensor to monitor the slope of the voltage signal through the switching element instead of the magnitude of the voltage, the minimum value can be detected, even in the absence of a zero voltage condition. This minimizes the power loss associated with a change of state of the switch compared to fixed delay approaches which may cause switching to occur during a period of sufficient voltage across the switch to produce a significant power loss. It is also an improvement over zero detect approaches for two reasons: (1) it avoids the disadvantage of the default fixed delay switching action in situations where a zero voltage situation fails to occur; and (2) the inventive adaptive drive circuit requires less energy to be stored in the LC tank circuit to cause the switching action, thereby further reducing the power consumption of the circuit in which the drive circuit is used.

Note that although the present invention is generally described in terms of causing a switching action upon detection of a substantially zero slope for the voltage signal through the switch as a function of time, in some circumstances, it is desirable and the invention may be used to cause a switching action when the slope of the voltage signal is not substantially equal to zero. This would occur, for example, in the situation in which the voltage signal curve was offset and took on negative voltage values, so that the minimum power loss arising from the switching action occurred at a voltage approximately equal to zero which corresponded to the voltage signal having a slope substantially not equal to zero.

As noted, the present invention has the benefit of being suited to use in situations in which the voltage across the switching component does not fall exactly to zero, but it is still important to minimize the power losses associated with the switching action. In addition to switch mode power converters, applications of the present invention include power oscillators, lamp ballasts, and power amplifiers, among others. Furthermore, although the present invention is described as being used to control the switching action of a FET device, the adaptive circuit(s) described herein can also be applied to control the switching behavior of bipolar transistors, IGBTs (insulated-gate bipolar transistors), valves, relays, and other power controlling elements.

In the following discussion, both analog and digital forms of the adaptive gate drive circuit of the present invention will be described. The circuit(s) may include an element for accommodating a time window within which the switch must be closed to allow the first-cycle at start-up of the power supply, power converter, or other circuit in which the present invention is incorporated.

FIG. 1A is a block diagram of the adaptive drive circuit of the present invention in a form suited for use in a general power controlling circuit. In the basic form shown in the figure, the present invention includes sensor 18 connected to switching element 13 in a manner which permits sensing of the voltage across switching element 13, with the output of sensor 18 controlling the switching action of that element. As shown in the figure, sensor 18 has as inputs the voltage between nodes 1 and 2 of the circuit, i.e., the voltage across switch 13. The output of sensor 18 is a control signal proportional to the rate of change (slope) of the voltage signal across switch 13 and is provided as an input to switch control signal generator 22. Switch control signal generator 22 responds to the output signal (i.e., a value of the output signal) of sensor 18 by generating a control signal which causes a change of state of switch 13 at the occurrence of the appropriate value of the output signal. With switch control signal generator 22 generating the switching sequence control signal when the voltage across switching 13 reaches either zero volts or a minimum value (i.e., the slope of the voltage signal is substantially equal to zero), the present invention can be used to efficiently reduce the power loss associated with the switching action. This is an improvement over both fixed delay and zero detect approaches which can result in higher switching power losses than the present invention. As noted, a problem with fixed delay approaches is that the switching voltage may or may not be at its minimum value when the switching occurs, thereby increasing the power loss. In addition, owing to variations in parts values and operating conditions of a circuit, a zero voltage situation may not occur during each and every cycle of the power switch. This means that a zero detect approach may not be an optimal solution for certain circuits or operating conditions.

Figure 1B:
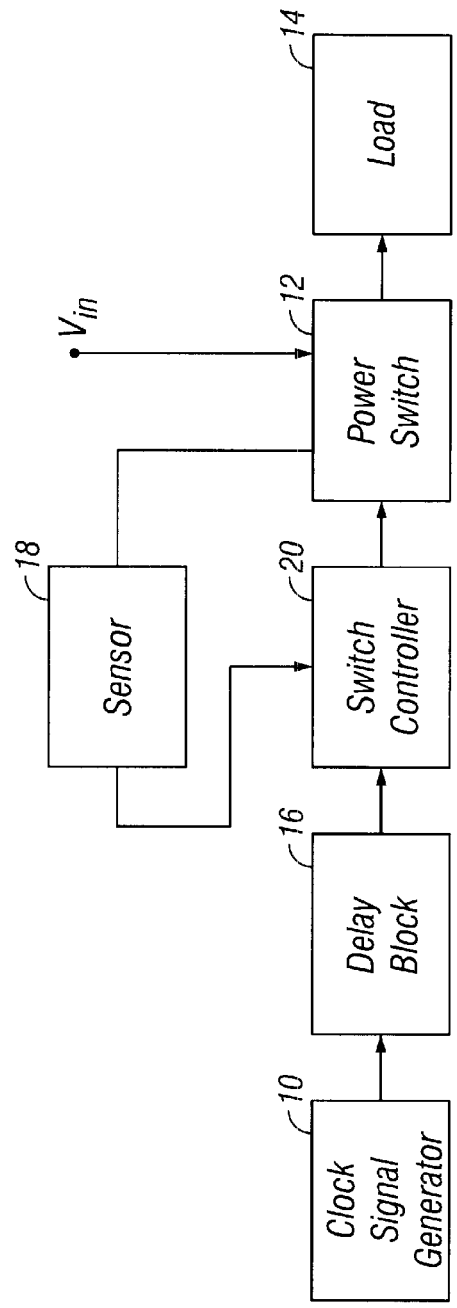
FIG. 1B is a block diagram showing the primary components of an embodiment of the adaptive drive circuit of the present invention as used in a switched power supply.

FIG. 1B is a block diagram showing the primary components of an embodiment of the adaptive drive circuit of the present invention as used in a switched power supply. As shown in the figure, a clock signal generator 10 provides a timing signal which is used to determine when power switch 12 will apply the input voltage, $V_{IN}$, to a load 14. Typically, clock signal generator 10 will utilize pulse width modulation (PWM) to vary the relative on and off times of switch 12 (typically as a function of the power supply's output voltage).

The clock signal output by generator 10 may be passed through an optional delay block 16, if necessary, to provide a fixed amount of delay needed to insure that switch 12 does not change state prior to the occurrence of another event which is part of the operation of the power supply or converter circuit (e.g., the shutting off of a clamping device). Sensor 18 is used to control the operation of switch controller 20 which operates switch 12 by passing the clock signal to the switch in a conventional fashion. Typically, switch controller 20 may include a buffer for use in driving the gate of switch 12 in the cases in which switch 12 is a FET or similar switching device. Note that switch controller block 20 is optional and may not be found in all embodiments of the invention. In the power supply embodiments of the present invention which will be described, sensor 18 senses a characteristic of the power supply circuit which can be related to the voltage across switch 12, e.g., the slope of the voltage signal across the power switch. When the voltage across switch 12 reaches a minimum value (i.e., zero or the minimum value) as indicated by the slope being approximately equal to zero, sensor 18 responds by producing a signal which causes switch controller 20 to operate to change the state of switch 12. Typically, this means passing a clock or gate drive signal to the switch to turn switch 12 "on" so that $V_{IN}$ is passed to load 14.

In this embodiment, the adaptive circuit of the present invention typically includes a capacitor connected to a FET switch drain terminal which acts as a sensor to detect the changing voltage ($V_{switch}$) across the FET power switch of a switch mode power supply or power converter. Because current through the capacitor is proportional to $dV_{switch}/dt$, the sensor acts to detect when the voltage through the switch has reached a minima. This is evidenced by a change in the capacitor output from a non-zero value (in this case negative since the voltage across the switch is decreasing) to a zero or very small value. The gate drive circuit of the invention holds the FET switch off (i.e., the switch is open) until the drain voltage has stopped moving down. At this time (i.e., $dV_{switch}/dt$ equal to zero or a very small value) the output of the capacitor changes from a non-zero to a zero or approximately zero value. This signifies that either the FET is clamped to ground (ZVS) or has reached the bottom of its resonant ring (LVS). The gate drive circuit then stops inhibiting the application of a gate drive signal, permitting the signal to turn the FET on, closing the switch. In the case of a switch mode power supply, this allows a new cycle of charging an inductor or primary winding of a transformer to begin.

In the context of switch mode power supplies, ZVS resonant power converters are electrically quieter (lower interference, i.e., EMI) than hard switching converters, and have lower switching losses. However, they may have lower efficiency because of the high current in the resonant LC tank circuit which is required to ensure zero voltage switching under all operating conditions. However, the inventors of the present invention have recognized that the efficiency of a ZVS converter can be maximized by designing it to have the minimum necessary tank current needed to just achieve ZVS under worst case conditions. Moreover, the efficiency can be further improved by using slightly less tank current than this critical value. The switch voltage will not quite reach zero volts in a worst case condition, but the turn-on switch loss will be less than the savings gained from using less than the critical tank current. Using this analysis, an LVS converter can be viewed as a ZVS converter where the tank current has been reduced to save power, so that the switch voltage doesn't quite make it all the way down to a value of zero.

The present invention can be used as an adaptive gate drive circuit for FETs and other switching devices in situations where the switch voltage determines the optimal time to change the state of the switch. This includes the power switches in ZVS and LVS converters, and synchronous rectifier switches.

In one embodiment, the present invention will be described in the context of an active clamp forward power converter (for example, as is shown in FIG. 6A). However, as mentioned, the invention is not limited to such applications and may be incorporated into other types of power controlling circuits. A basic implementation of the invention is one in which a capacitor connected to the drain of a FET power switch is used as the zero or low voltage situation sensor. The capacitor acts to hold the FET gate drive signal low until the drain voltage has stopped falling. At that time the gate drive signal is passed to, and acts to operate the FET switch.

It is noted that the extra transformer leakage inductance needed for ZVS operation in an active clamp forward converter results in a lower power conversion efficiency. However, a smaller leakage inductance results in the switch voltage not reaching zero. Therefore, the FET is typically turned "on" as its drain voltage swings through a minima after the clamping device has shut off, where the minima lasts only a very short time. The frequency of the resonant ring varies with transformer leakage inductance and FET capacitance. The time for the FET voltage to drop to minimum depends on the frequency of the resonant ring and it's initial conditions, power supply load, and input voltage. Therefore, the amount of delay between clamping of the voltage and the turn on of the switching device should adapt to these variable factors to ensure optimal timing of the switching action. The present invention addresses this adaptation requirement by making control of the switching operation(s) dependent on the voltage across the switching element(s). This allows the present invention to produce optimal switching of the switches regardless of the parts' tolerances or load conditions under which the power supply, converter, or other circuitry is operating.

In the context of power supplies or converters, FIG. 5A is a diagram of a two-switch LVS converter which may be operated using the adaptive gate drive circuit of the present invention. FIG. 5B is a timing diagram showing a typical timing sequence for operation of the two-switch LVS converter of FIG. 5A, and illustrates the time window during which the power switch of such a circuit should be closed. In FIG. 5A, the two switches, SW1 and SW2, may represent the clamp and power switches of an active clamp forward converter, or may represent the two switches of a resonant converter. The inductance may be the leakage inductance of the active clamp forward converter transformer, or it may be the inductance of a resonant load.

With reference to FIG. 5B, there are two timing issues related to the operation of the present invention. Firstly, the turn on of the switching element SW2 (typically a FET) must be delayed until the clamping device SW1 (typically a diode, or the body diode of a second FET) has turned off. Secondly, the gate drive signal used to turn on the switching element must be delayed until the voltage across the switch reaches either zero or a minima. In accordance with the present invention, proper timing of the gate drive signal is achieved by sensing when the rate of change of the voltage across the switch element (i.e., $dV_{switch}/dt$) reaches zero. This indicates either a situation of zero volts across the switch, or a minimum value. In the present invention a capacitor connected to the FET switch drain is used as a sensor to detect when the switch voltage falls to its minimum value. This is done by using the occurrence of zero current through the capacitor (which is proportional to $dV_{switch}/dt$) to trigger application of a gate drive signal to the switch. Note that because the switch voltage is falling, the $dV_{switch}/dt$ signal is going from a negative value to either zero or a very small value. In the present invention, the slope of the switch voltage signal, instead of a fixed delay period or the magnitude of the voltage signal, controls the switching behavior of the FET power switch.

Referring again to FIG. 5B, a delay circuit is used to partially delay the gate drive signal which controls the switching action of the power switch FET. The amount of delay is set to a non-critical, nominal value. This fixed portion of the total delay between turn off of the clamping device and turn on of the power switch is not critical because its control of the switching operation is automatically terminated when the dV/dt sensor detects a negative edge on the drain voltage waveform. When the dV/dt sensor detects such an edge, the capacitor output (i.e., the dV/dt signal) assumes control of suppressing the switch turn on. Note however, that the fixed delay should be of sufficient length to permit the clamping device in the power supply or converter to shut off and for the drain voltage signal to begin its descent.

When the clamping device (or corresponding switching element) is shut off (corresponding to time $t_0$ in FIG. 5B), the reverse current flowing in the leakage and/or magnetizing inductances of the power supply or converter begins to discharge the parasitic junction capacitances of the power switch and clamping FETs. This causes the drain voltage on the switching FET to descend rapidly, producing a non-zero, negative $dV_{switch}/dt$ signal at the output of the capacitor sensor. By sensing the rate of descent of the drain voltage, the drain voltage signal minima can be detected. When the drain voltage signal flattens out at the bottom of its descent, the dV/dt sensor produces little or no signal. This means the capacitor output goes from a non-zero value to either zero or a very small value. This situation discontinues the suppression of the gate drive signal and initiates the turn on signal sequence for the power switch FET.

The present invention thus uses information about the slope of the drain voltage signal to adaptively control the timing of the turn on of the FET (or other) power switch. The duration of the LC tank (formed by the leakage inductance and parasitic capacitance(s)) ring down and the duration of the drain voltage waveform minima will vary with operating and load conditions, and component tolerances. This presents a problem for fixed delay and zero-detect approaches to the timing of the switch operation. The present invention overcomes this problem by using information regarding the state of the circuit to determine when the power switch is turned on. The effect of operating conditions and tolerance variations are relatively small compared to the change in magnitude of the differentiated signal, i.e., the slope of the negative going edge versus the slope during the flattening out at the minima of the drain voltage. Thus, by detecting the slope of the FET power switch drain voltage waveform and using its change from a non-zero value to zero or a small value, the signal used to turn on the FET can be optimally controlled to reduce switch stress and power loss regardless of system and component variations.

Another issue of relevance to the present invention is that the clock signal described with reference to FIG. 1B is not necessary to practice the present invention. Although certain of the figures described herein do show a clock signal, the present invention is applicable to free running applications that do not have a clock. Instead of a clock signal which is delayed until $dV_{switch}/dt=0$, in the absence of a clock, the switch may be turned on every time it's voltage swings down to zero or the minimum by an adaptive gate drive circuit of the type shown in FIG. 1A. The switch may then be turned off each cycle by a controller, with a "kick start" used to get the circuit oscillating in the first place. In such a case, the elements responsible for the switch turn off and oscillator kick start are not a part of the circuit block that turns the switch on at zero/minimum voltage.

Figure 2A:
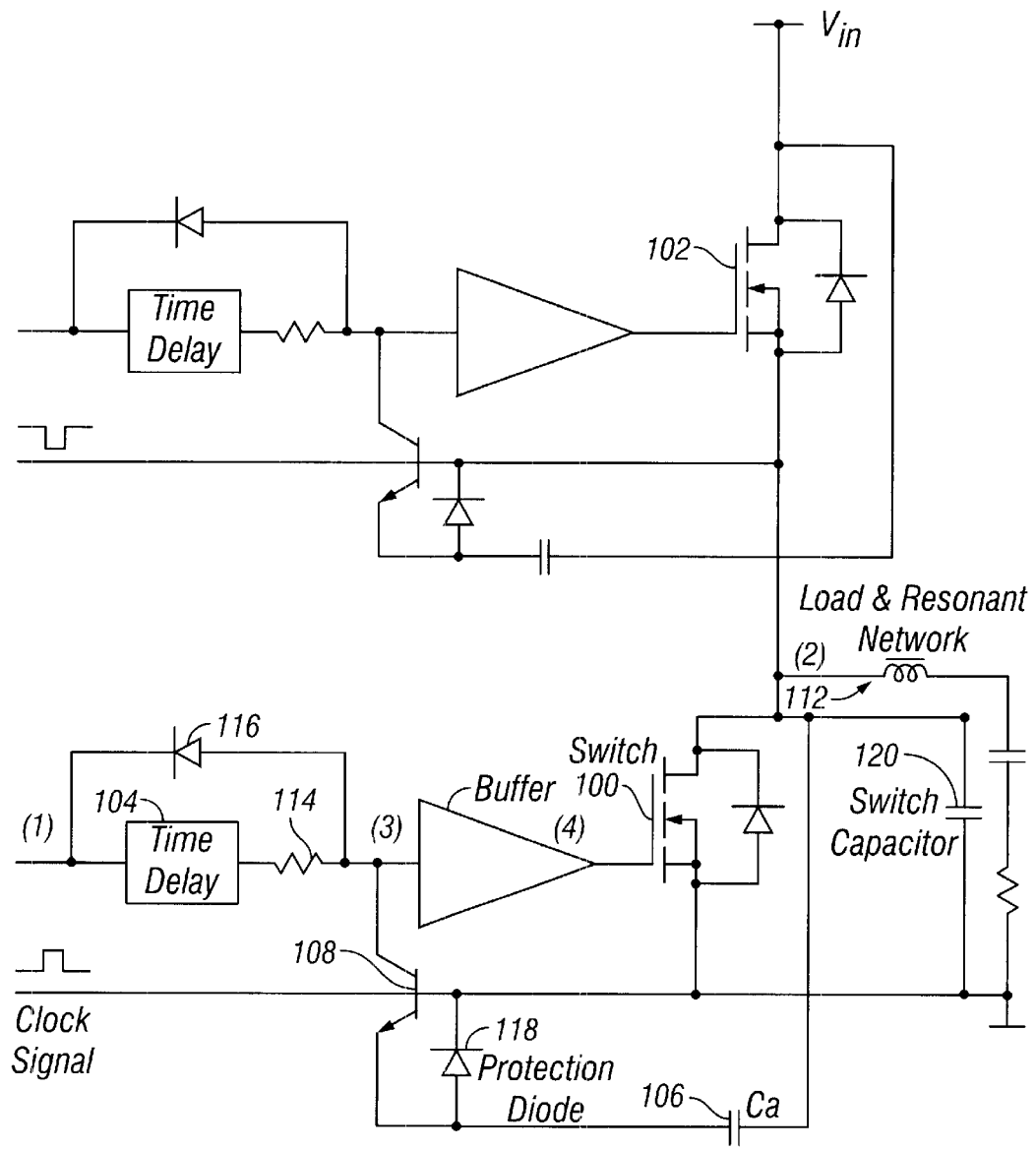
FIG. 2A is a schematic diagram showing how two adaptive gate drive circuits of the present invention can be used to control the two switch FETs in a half-bridge ZVS series-resonant converter.

FIG. 2A is a schematic diagram showing how two adaptive gate drive circuits of the present invention can be used to control the two power switch FETs in a half-bridge ZVS series-resonant converter. FIGS. 2B-1 to 2B-8 show the waveforms for the signals involved in the control of the operation of the switching FETs of FIG. 2A. Note that the waveforms shown in FIGS. 2B-1 to 2B-8 are applicable to the operation of most types of ZVS converters. The gate drive circuits of the present invention are also applicable to single switch resonant converters, such as the Class-E converter shown in FIG. 4C. For such single switch converters, a description of the circuit operation starts with the power switch voltage falling, and continues as will be described. The description for two switch converters starts earlier, with the gate signal from the control circuit turning off the top power switch. There will be a small propagation delay, then the top switch turns off, and the switch voltage at node (2) falls.

Note that as shown in FIG. 2A, the clock (gate drive) signals for the two FETs (elements 100 and 102) are inverted versions of each other. The clock signal at node (1), which is used to operate switch 100, goes high as shown in FIG. 2B-1. As mentioned, it is fed through a time delay block 104 to give time for the other switch (element 102) to be turned off, and for the voltage across switch 100 to start to fall. The resulting delayed version of the clock signal at node (1) is shown in FIG. 2B-2. After switch 102 is turned off, the reverse current flowing in the resonant network 112 begins to discharge the parasitic capacitance(s) of the switching devices. This capacitance is shown as switch capacitor 120 in FIG. 2A. The switch voltage (the voltage across switch 100) at node (2) then begins to fall. The waveform for the switch voltage, i.e., the drain voltage of FET switch 100 is shown in FIG. 2B-3. The decrease in the voltage across the power switch causes current to flow through capacitor Ca 106, which holds down the voltage at node (3) via conduction through transistor 108. The waveform for the current in capacitor Ca 106 is shown in FIG. 2B-4. The negative current flowing through capacitor Ca 106 keeps buffer 110 off, so that the clock signal at node (1) is not provided to switch 100. Buffer 110 provides the power needed to drive the FET gate capacitance 120 of switch 100 high or low. The combination of Ca 106 and buffer 110 holds FET 100 off for as long as the switch voltage at node (2) is falling. The switch voltage drops below zero volts, and the body diode of switch 100 then conducts load current previously stored in load and resonant network 112.

As the voltage at node (2) stops falling, the output of capacitor 106 ($dV_{switch}/dt$) reaches zero or a small value. This means that current stops flowing in capacitor Ca 106, and the voltage at node (3) is pulled up by resistor 114. This causes a change in state of the signal provided at the output of capacitor 106. Thus, the change in behavior of $dV_{switch}/dt$, which signifies either a condition of zero or minimum switch voltage, is used to control the application of the gate drive signal to the power switching FET. After a short propagation delay through buffer 110, the FET switch gate voltage at node (4) is driven high by the gate drive signal. This causes switch 100 to turn on. Current flows in the switch (the channel resistance of the FET) instead of the body diode. Switch 100 stays on until the gate drive signal (i.e., the clock signal) at node (1) goes low. A diode 116 pulls the voltage at node (3) down to near zero volts. After a propagation delay through buffer 110, the gate drive signal turns FET switch 100 off. Waveforms for the voltage at node (3) and node (4) are shown in FIG. 2B-5.

The voltage across switch 100 then rises (see FIG. 2B-3). Capacitor Ca 106 is charged since switch 100 is open, with current flowing through protection diode 118 to ground. Node (3) is held at a level equal to a diode drop above zero volts by the clock (gate drive) signal. The switch voltage at node (2) hits the top rail, current stops flowing in Ca 106, and the lower FET (element 100) gate drive circuit awaits the next cycle of the converter. FIG. 2B-6 shows the waveform for the current in switch capacitor 120, which is the parasitic capacitance associated with the FET. FIG. 2B-7 shows the current in the body diode of switch 100. FIG. 2B-8 shows the current in switch 100.

Figure 3A:
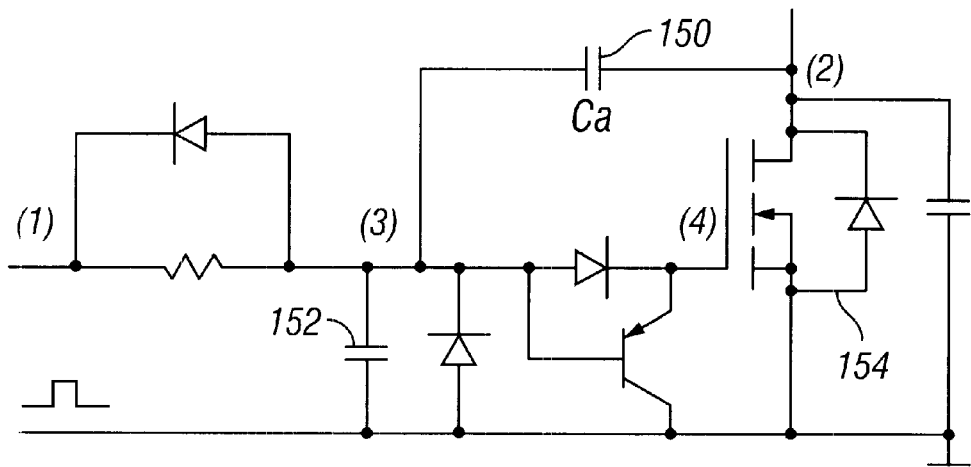
FIG. 3A is a schematic diagram showing an analog version of the adaptive gate drive circuit of the present invention.
Figure 3B:
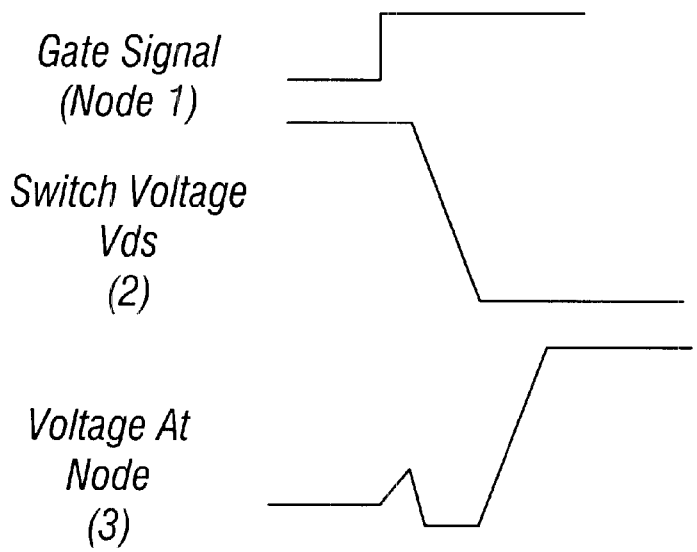
FIG. 3B shows the waveforms for the signals involved in the control of the operation of the circuit of FIG. 3A.
Figure 3C:
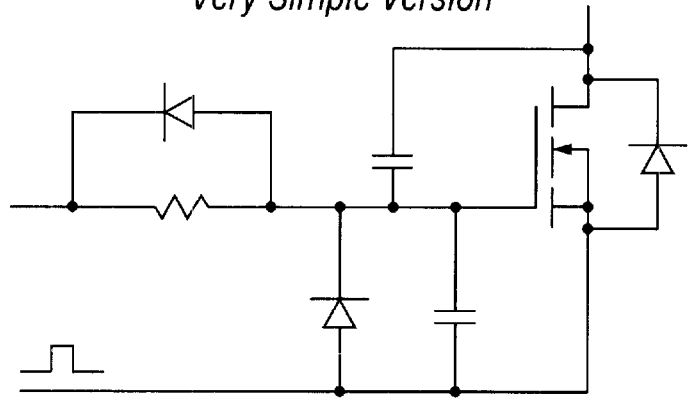
FIG. 3C is a schematic diagram of a simplified analog version of the adaptive gate drive circuit of the present invention.
Figure 3D:
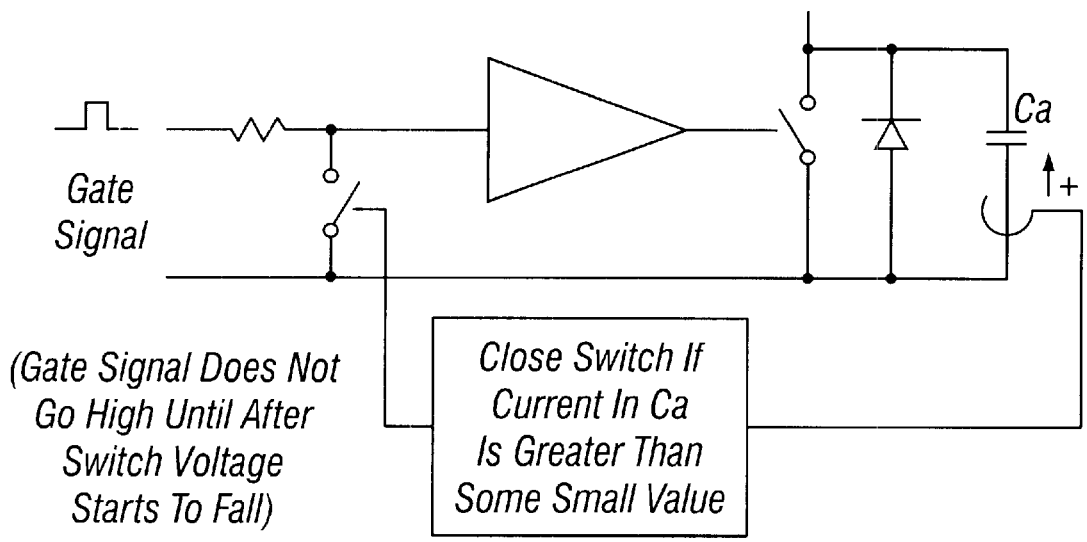
FIG. 3D is a schematic diagram describing the operation of a ZVS adaptive gate drive circuit of the present invention.

FIGS. 3A, 3C, and 3D are examples of circuits which can be used to practice the present invention in lieu of the embodiment of the inventive adaptive gate drive circuit shown in FIG. 2. FIG. 3A is a schematic diagram showing an analog version of the adaptive gate drive circuit of the present invention. The time delay element is provided by an RC configuration between nodes (1) and (3). Referring to the waveforms shown in FIG. 3B, as the clock (gate drive) signal at node (1) goes high, the voltage at node (3) starts to rise. The switch voltage at node (2) falls, and capacitor Ca 150 pushes down the voltage at node (3) to below zero volts. The switch voltage stops falling ($dV_{switch}/dt$ is zero or a small value), capacitor 152 at node (3) charges up, and FET switch 154 is turned "on". Note that in general, a gate signal may be defined as not going "high" until after the switch voltage starts to fall.

As noted, in the analog circuit of FIG. 3A, the switch diode conduction time is primarily determined by the time taken by the RC configuration at node (3) to charge up to the gate threshold voltage of FET 154. This RC time should be longer than any initial propagation delay.

FIG. 3C is a schematic diagram of a simplified analog version of the adaptive gate drive circuit of the present invention. FIG. 3D is a schematic diagram describing the operation of a ZVS adaptive gate drive circuit of the present invention. As indicated in the figure, the clamping switch placed prior to the buffer is open or closed based on the current in the capacitor. When the current is greater than zero or a small value, the switch is closed. This prevents the gate drive signal from being provided to the power switch. When the capacitor current is zero or a small value (i.e., the voltage across the power switch is either zero or a minimum value), the clamping switch is opened. This permits the gate drive signal to pass through the buffer and operate the power switch. As mentioned, the time taken for the switch voltage to fall to zero depends on the load current and supply voltage. It will also vary due to the tolerance and temperature dependence of the switch capacitance. The switch control circuits of the present invention adapt to these variations, and hold the power switch off for as long as the switch voltage is falling. This is an improvement over switching schemes relying on a fixed delay, which may not cause switching at the optimal time to reduce power losses, or schemes relying on the detection of a zero voltage condition, which may not always occur.

It is preferable for the switch to be turned on as soon as possible after the switch voltage has fallen below zero, and shorted the associated body diode. This is because reducing the conduction time of the diode will reduce the power loss. The waveforms in FIGS. 2B-1 to 2B-8 show the current flowing in the switch capacitor as the switch voltage falls, transfers to the switch diode, then flows in the switch when it is turned on.

If the LC tank circuit formed by the load does not have sufficient tank energy to ring the switch voltage entirely down to zero, then the switch voltage goes through a minima, and starts to ring back up again. For example, consider the behavior of the analog circuit of FIG. 3A under these conditions. As the switch voltage reaches its minima, Ca 150 stops holding node (3) down, and the gate voltage at node (4) starts to rise. When the FET gate reaches threshold, FET 154 starts to turn on, but that feeds back through Ca 150 to node (3), and stops the gate voltage from rising any further. The FET enters a linear mode, and turns on slowly. The time taken for the switch voltage to ramp down to zero volts is the time taken for Ca 150 to be discharged by the current flowing in the resistor between nodes (1) and (3).

Figure 4A:
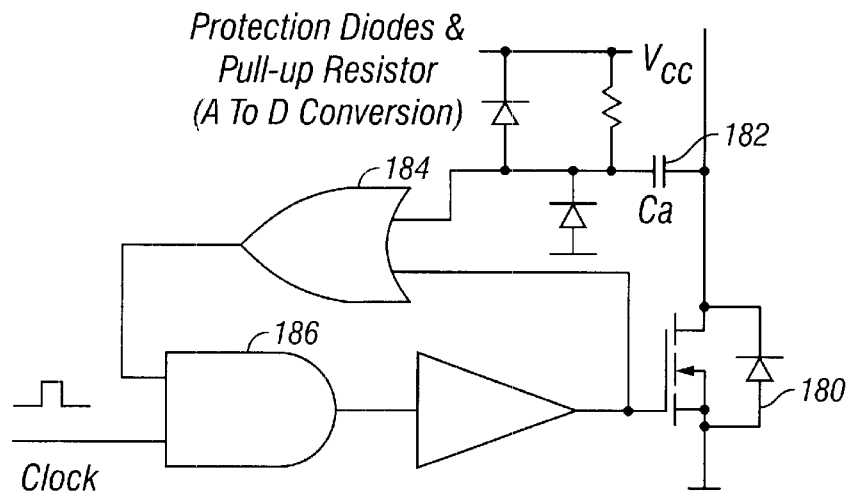
FIG. 4A is a schematic diagram of a digital logic implementation of the adaptive gate drive circuit of the present invention.

FIG. 4A is a schematic diagram of a digital logic implementation of the adaptive gate drive circuit of the present invention. The logic circuit in FIG. 4A turns switch 180 "on" when the switch voltage reaches its minima. The signal from Ca 182 is ignored when the switch turns on, and so there is no negative feedback path and the switch is turned on quickly.

Figure 4C:
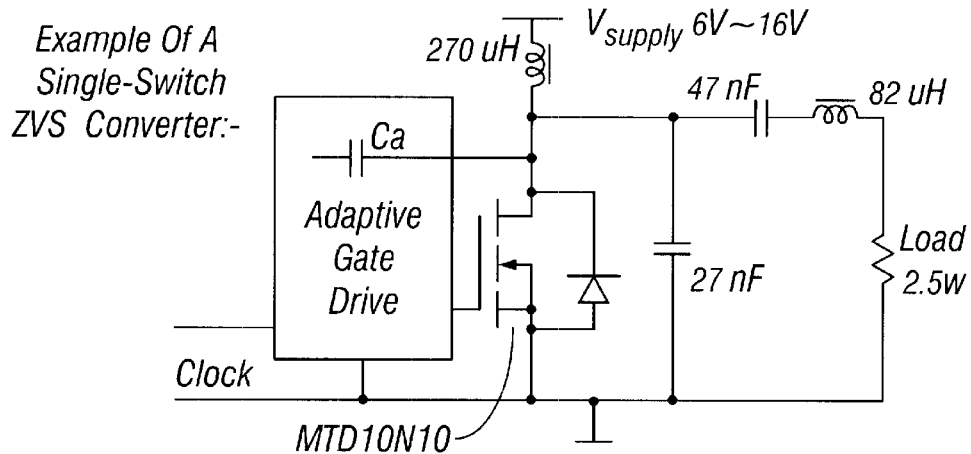
FIG. 4C is a schematic diagram of a circuit for a single switch Class E inverter which includes the adaptive gate drive circuit of the present invention.
Figure 4B:
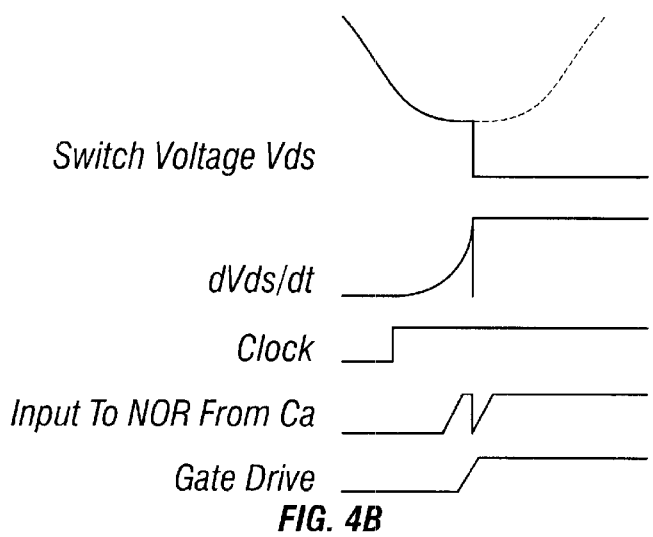
FIG. 4B shows the waveforms for the signals involved in the control of the operation of the circuit of FIG. 4A.

Referring to the waveforms shown in FIG. 4B, the falling switch voltage, via Ca 182, causes a logic 0 on the output of OR gate 184, which serves as an input to AND gate 186. The result is that FET 180 is held "off." When the rate of change of the switch voltage slows down, approaching the minimum switch voltage, OR gate 184 input goes high, OR gate 184 output goes high, AND gate 186 output goes high, and FET 180 is turned "on." Gate drive going high (clock high) means OR gate output 184 stays high, even as the FET turns "on" and pulls down on Ca 182. The signal from Ca 182 is therefore ignored, or "blanked", as the FET turns "off". Capacitor Ca 182 is chosen to have a small value to keep current, size, and cost small. The pull-up resistor is chosen to make the voltage at the low end of Ca 182 rise when the switch voltage is slowing down, just prior to the minima. This anticipation of the minima provides time for the logic to respond and time for the gate of FET 180 to be charged up.

In terms of component values, if a Class-E switch voltage falls at 20V/us, then capacitor Ca should be chosen to carry a current of 1 mA, and hence Ca=1 mA*1 us/20V=50 pF. An active clamp forward converter switch voltage will fall at a much faster rate (e.g., 4,000V/us) and need a much smaller capacitor Ca=1 mA/4,000V/us=0.25 pF. A higher capacitance value will cause a higher current to flow in capacitor Ca, and the protection diodes to ground and Vcc supply rails. The pull-up resistor may be chosen to cause the NOR gate input and output to go high when the current in capacitor Ca has dropped to 0.25 mA. If logic supply voltage Vcc=5V and NOR gate has a high impedance input with a threshold voltage of 2.5V, then the pull-up resistor value is found from (5V−2.5V)/0.25 mA=10K.

A further consideration is that the component values should be selected so that noise spikes on the voltage signal through the switch will not cause a change in the state of the switch. As noise spikes may cause local voltage minima which could produce a momentary value of zero for the sensor output, the value of capacitor Ca (or another component) should be selected so that it is sufficient to filter out any expected noise spikes.

The Class E inverter shown in FIG. 4C is an example of a single-switch ZVS converter. The component values are taken from the paper entitled "A Low-Cost Control IC for Single-Transistor ZVS Cold-Cathode Fluorescent Lamp Inverters and DC/DC Converters", Redl et al. discussed previously. In the example, the control circuit clock signal will go high when the switch voltage is falling, so there is no need for a minimum time delay.

As previously mentioned, ZVS Resonant power converters are electrically quiet, and have low switching losses. However, they usually have lower efficiency because of the high current in the resonant LC tank. The efficiency of a ZVS converter can be maximized by designing for minimum necessary tank current to just achieve ZVS under worst case conditions. Moreover, efficiency can be further improved by using a little less tank current than this critical value. The switch voltage will not quite reach zero volts, but the extra turn-on switch loss will be less than the savings gained from using less than the critical tank current. The worst case condition may only last a short time (e.g., a pulse load at start-up, or a supply voltage transient). LVS operation and a drop in efficiency at this extreme condition may be acceptable, particularly since the lower tank current will give improved efficiency during normal running conditions. This provides the motivation for an adaptive gate drive circuit capable of turning the power switch on at the point of its minimum voltage.

FIG. 6A is a schematic diagram showing the adaptive gate drive circuit of the present invention as used in an active clamp forward converter circuit. FIG. 6B is a graph of the voltage through the power switch for the circuit of FIG. 6A. As noted, the extra transformer leakage inductance needed for ZVS in an active clamp forward converter results in lower power conversion efficiency. However, a smaller leakage inductance results in the switch voltage not reaching zero. The switch is ideally turned on at the bottom of its resonant swing, because this gives minimum turn-on switch loss due to the discharge of the switch capacitance energy, ½ $CV^2$. The primary FET (element 200 in the figure) must be turned "on" as its drain voltage swings through a minima, where this state lasts for only a very short time. The required time delay from turning clamp FET 202 "off" to primary FET 200 being turned "on" at the minima varies with transformer leakage inductance, FET capacitance, load and input voltage. The present invention permits accommodation to these variables, while achieving optimal switching behavior.

In FIG. 6A, the pulse width of the switching control signal is controlled by the signal "PWM logic" at the input to AND gate 204. In the following description it is assumed that the value of "PWM logic" is high, allowing primary FET 200 gate to be driven. Active clamp FET 202 is preferably driven as shown, using the circuit described in U.S. Pat. No. 5,304,875, entitled "Efficient Transistor Drive Circuit for Electrical Power Converter Circuits and the like," assigned to the assignee of the present invention, and the contents of which are hereby incorporated by reference. At the start of each cycle, clamp FET 202 is turned off by a current pulse (e.g., 250 mA for 250 ns) produced by the current pulse generator and initiated by the clock signal going high. Transistor Q343 is turned off, starting the timer circuit composed of the 10 pF capacitor, 50 uA source, and comparator.

After an initial small delay (e.g., 50 nanoseconds), the drain voltage of primary FET 200 falls, feeding a non-zero current value (dV/dt) through capacitor Ca 206. Transistor Q365 pulls down on the input to buffer 208, which holds the gate of primary FET 200 low for as long as the drain voltage is falling. Note that this part of the circuit operates in the manner described with reference to the circuit of FIG. 2A.

Transistor Q364 is also turned on by the current in Ca 206, which rapidly discharges the 10 pF capacitor to below 3V, putting a logic 1 on the input to AND gate 204, and producing a logic 1 as the output of the AND gate. As the drain voltage of primary FET 200 stops falling (indicating the value of zero or a minima for the voltage across the power switch), the output of capacitor 206 approaches zero, and transistor Q365 stops conducting. This causes the input of buffer 208 to go high, causing primary FET 200 to be turned on. Transistor Q366 is also turned on. When primary FET 200 turns on and pulls down again on Ca 206, the current is shorted to ground by Q366. This serves the same blanking function as the OR gate sensing the gate voltage in FIG. 4A.

At the start of the first cycle, there will be no energy in the power converter and the drain voltage will not move. Thus, for the first cycle, another method of controlling the switching operation of the power switch is required. This is accomplished because the timer circuit 10 pF capacitor is discharged by 50 uA through a one volt swing in 200 ns. The comparator output then goes high and primary FET 200 is turned on.

Note that for the circuit of FIG. 6A, there are two primary sources of delay in turning on the power switch the capacitor current goes to either a small value or zero. The first source of delay is the propagation delay through the PWM logic and output stages. This delay can be reduced by reducing the rise time of the PWM signal. The second source of delay is the rise time of the output signal which is used to control suppression of the gate drive signal. This delay can be reduced through known design considerations and processing techniques.

Note that there is a difference in the way the adaptive gate drive circuits shown in FIGS. 2 and 3 work with a LVS condition, and how the digital circuits in FIGS. 4 and 6 work with a LVS operation. This difference is due to the blanking of the dV/dt signal as the switch is turned on. Under LVS conditions, the switch in FIGS. 2 and 3 is turned on slowly because of negative feedback. In contrast, the switch in FIGS. 4 and 6 is turned on quickly because of the blanking behavior.

An adaptive circuit for controlling the switching action of a power switch in a power supply or converter has been described. The circuit includes a sensor which is used to sense the rate of change of the voltage across the switch. In the case of a FET used as the power switch, this corresponds to the slope of the drain voltage signal of the of the FET. The sensor output changes from a non-zero value to a zero or very small value when the rate of change of the drain voltage decreases from a large to a relatively small value. This causes the adaptive circuit to discontinue its action of suppressing a gate drive signal for the FET, thereby initiating a turn on sequence for the FET. In a preferred embodiment, the sensor is a capacitor connected to the FET drain. In such a case, the output of the capacitor is proportional to $dV_{switch}/dt$. Both analog and digital versions of the adaptive circuit of the present invention have been disclosed. The adaptive circuit may be used in power supplies, converters, and other circuits in which a controllable switching element is present and it is desired to optimize the time at which the state of the switching element is changed to reduce power losses associated with the switching action.

In the context of a power converter circuit, the inventive apparatus and method allows the converter to be designed to have less inductive energy in the tank elements so that the switch voltage does not fall all the way to zero. In this situation, the inventive adaptive method senses when the voltage is slowing down and is just about to reach it's minimum and then (with a small propagation delay) causes the state of the switching element to be changed. In this sense the adaptive circuit anticipates the minimum voltage value through the switching element.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

What is claimed is:

1. An adaptive drive circuit for controlling a change of state of a switch, comprising:
    a switch state control signal generator;
    a sensor coupled between said switch and said switch state generator for generating a sensor output signal proportional to a rate of change of the voltage across the switch, said switch state control signal generator acting in response to said sensor output signal to generate a control signal to change the state of the switch when the sensor output signal is substantially equal to a predetermined value;
    such that the voltage across the switch is at a reduced level when the switch changes state.

2. The circuit of claim 1, wherein the switch is a field effect transistor.

3. The circuit of claim 1, wherein the sensor is a capacitor.

4. The circuit of claim 2, wherein the sensor is a capacitor coupled to the drain of the field effect transistor.

5. The circuit of claim 1, wherein the predetermined value is zero.

6. The circuit of claim 1, wherein the switch is a bipolar transistor.

7. The circuit of claim 1, wherein the switch is an insulated-date bipolar transistor.

8. The circuit of claim 1, wherein the switch is a power switch.

9. The circuit of claim 1, wherein the reduced level is a minimized voltage.

10. The circuit of claim 1, wherein the reduced level is about zero volts.

11. A switch mode power supply, comprising:
    a clock signal generator operative to generate a clock signal;
    a power switch responsive to the clock signal to couple a voltage to a load or to decouple the voltage from the load; and
    a sensor which continuously monitors a voltage across the switch, said sensor producing a sensor output signal proportional to a rate of change of the voltage across the power switch, the sensor output signal suppressing the response of the power switch to the clock signal until the sensor output signal is substantially equal to a predetermined value;
    such that the voltage across the power switch is at a reduced level when the power switch changes state.

12. The power supply of claim 11, wherein the power switch is a field effect transistor.

13. The power supply of claim 12, wherein the sensor is a capacitor coupled to the drain of the field effect transistor.

14. The power supply of claim 12, further comprising:
    a switch controller interposed between the clock signal generator and the power switch and responsive to the clock signal to provide a gate drive signal to the field effect transistor, wherein the sensor output signal suppresses the response of the switch controller to the clock signal until the sensor output signal is substantially equal to the predetermined value.

15. The power supply of claim 14, wherein the switch controller is a buffer.

16. The power supply of claim 11, wherein the sensor is a capacitor.

17. The power supply of claim 11, wherein the predetermined value of the sensor output signal is zero.

18. The power supply of claim 11, further comprising:
    a delay circuit interposed between the clock signal generator and the power switch operative to delay the clock signal by a predetermined amount.

19. The power supply of claim 11, wherein the reduced level is a minimized voltage.

20. The power supply of claim 11, wherein the reduced level is about zero volts.

21. A method of changing a state of a switch, comprising the steps of:
    sensing a voltage across the switch;
    generating a control signal proportional to a rate of change of the sensed voltage, wherein the control signal has a substantially non-zero value when the voltage across the switch is changing and a value substantially equal to zero when the voltage across the switch is substantially constant;
    changing the state of the switch when the control signal has a value substantially equal to zero; and
    providing the control signal to a clock signal controller which provides a clock signal to change the state of the switch.

22. The method of claim 21, wherein the step of providing the control signal to the clock signal controller further comprises the step of:
    suppressing the clock signal when the control signal has substantially non-zero value and providing the clock signal to the switch when the control signal has a value substantially equal to zero.

23. A method of operating a switch, comprising the steps of:
    sensing a voltage across the switch;
    generating a control signal proportional to a rate of change of the sensed voltage;
    changing the state of the switch when the control signal has a value substantially equal to a predetermined value; and
    providing the control signal to a clock signal controller which provides a clock signal to change the state of the switch;
    such that the voltage across the switch is at a reduced level when the switch changes state.

24. The method of claim 23, wherein the step of providing the control signal to the clock signal controller further comprises the step of:
    suppressing the clock signal when the control signal has a value substantially not equal to the predetermined value and providing the clock signal to the switch when the control signal has a value substantially equal to the predetermined value.

25. The method of claim 23, wherein the reduced level is a minimized voltage.

26. The method of claim 23, wherein the reduced level is about zero volts.

27. An adaptive drive circuit for controlling a change of state of a field effect transistor, comprising:

a sensor which continuously monitors a voltage across the field effect transistor, said sensor producing a sensor output signal proportional to a rate of change of the voltage across the field effect transistor, comprising a first capacitor coupled between the drain of the field effect transistor and the control signal generator and a second capacitor connected in parallel across the drain and source of the field effect transistor, the second capacitor being the parasitic capacitance of the field effect transistor;

a switch state control signal generator responsive to the sensor output sign al to generate a control signal to change the state of the field effect transistor when the sensor output signal is substantially equal to a predetermined value;

such that the voltage across the field effect transistor is at a reduced level when the field effect transistor changes state.

* * * * *